US012763793B2

(12) United States Patent
Zeng et al.

(10) Patent No.: US 12,763,793 B2
(45) Date of Patent: Oct. 13, 2026

(54) METHODS AND APPARATUSES FOR STORING GRAPH DATA OF A RELATIONSHIP NETWORK GRAPH

(71) Applicant: Alipay (Hangzhou) Information Technology Co., Ltd., Hangzhou (CN)

(72) Inventors: Xintan Zeng, Hangzhou (CN); Yongchao Liu, Hangzhou (CN)

(73) Assignee: Alipay (Hangzhou) Information Technology Co., Ltd., Hangzhou (CN)

( * ) Notice: Subject to any disclaimer, the term of this patent is extended or adjusted under 35 U.S.C. 154(b) by 127 days.

(21) Appl. No.: 18/956,847

(22) Filed: Nov. 22, 2024

(65) Prior Publication Data

US 2025/0211250 A1 Jun. 26, 2025

(30) Foreign Application Priority Data

Dec. 22, 2023 (CN) ........................ 202311788004.6

(51) Int. Cl.
*H03M 7/30* (2006.01)

(52) U.S. Cl.
CPC ....... *H03M 7/3066* (2013.01); *H03M 7/3077* (2013.01); *H03M 7/6011* (2013.01)

(58) Field of Classification Search
CPC ............. H03M 7/3066; H03M 7/3077; H03M 7/6011; H03M 7/70; G06F 16/221; G06F 16/1744; G06F 16/9024
See application file for complete search history.

(56) References Cited

U.S. PATENT DOCUMENTS 9,645,999 B1 * 5/2017 Ciulla ..................... G06F 16/35
9,836,183 B1 * 12/2017 Love ..................... G06F 16/904
(Continued)

FOREIGN PATENT DOCUMENTS

CN 110489428 A 11/2019
CN 113609347 A 11/2021
(Continued)

OTHER PUBLICATIONS

Gupta et al., "Columnar Storage and List-based Processing for Graph Database Management Systems," Proceedings of the VLDB Endowment, Jul. 2021, 14(11):2491-2504.

*Primary Examiner* — Lam T Mai
(74) *Attorney, Agent, or Firm* — Fish & Richardson P.C.

(57) ABSTRACT

A computer implemented method for graph data storage includes acquiring connection relationship information between any two nodes in a relationship network graph including a directed connecting edge between nodes. Based on the connection relationship information, a first mapping relationship between an identifier of each node and a node identifier of an outgoing edge-connected node of the node in a compressed sparse row format is stored. A second mapping relationship between the identifier of each node and a node identifier of an incoming edge-connected node of the node in a compressed sparse column format is stored. A set of attribute information in the relationship network graph is acquired, where the set of attribute information comprises several node attributes, several edge attributes, and/or several pieces of temporary information. Using column storage, storing each attribute value of a same attribute in the set of attribute information in continuous space.

20 Claims, 3 Drawing Sheets

(56) References Cited

U.S. PATENT DOCUMENTS

| | | | | |
|---|---|---|---|---|
| 11,436,504 | B1 * | 9/2022 | Lukarski | G06N 5/04 |
| 12,135,713 | B2 * | 11/2024 | Ouyang | G06F 11/3409 |
| 12,585,973 | B1 * | 3/2026 | Krishnan | G06N 10/60 |
| 2008/0104276 | A1 * | 5/2008 | Lahoti | G06F 21/6218 709/245 |
| 2014/0280047 | A1 * | 9/2014 | Shukla | G06F 16/24554 707/769 |
| 2016/0299991 | A1 * | 10/2016 | Hong | G06F 16/2246 |
| 2016/0371392 | A1 * | 12/2016 | Brown | G06F 16/81 |
| 2017/0277687 | A1 * | 9/2017 | Sammis | G06F 16/2246 |
| 2019/0205480 | A1 * | 7/2019 | Zhang | G06F 16/90348 |
| 2019/0317963 | A1 * | 10/2019 | Erler | G06F 16/902 |
| 2020/0242474 | A1 * | 7/2020 | Lo | G06N 3/063 |
| 2020/0244282 | A1 * | 7/2020 | Bajic | G06F 17/16 |
| 2022/0004580 | A1 * | 1/2022 | Li | G06F 16/90335 |
| 2022/0156322 | A1 * | 5/2022 | Singh | G06F 16/9024 |
| 2025/0077580 | A1 * | 3/2025 | Zhang | G06F 16/00 |

FOREIGN PATENT DOCUMENTS

| | | | |
|---|---|---|---|
| CN | 115470376 | A | 12/2022 |
| CN | 115587279 | A | 1/2023 |
| CN | 117076813 | A | 11/2023 |
| CN | 117170827 | A | 12/2023 |

* cited by examiner

| | 0 | 1 | 2 | 3 | 4 |
|---|---|---|---|---|---|
| 0 | | 1 | 1 | 1 | |
| 1 | | | 1 | | 1 |
| 2 | | | | | 1 |
| 3 | | | 1 | | |
| 4 | | | | | |

| | | | | | | | |
|---|---|---|---|---|---|---|---|
| **Fourth array** | 0 | 0 | 1 | 4 | 5 | 7 | |
| **Third array** | 0 | 0 | 1 | 3 | 0 | 1 | 2 |

METHODS AND APPARATUSES FOR STORING GRAPH DATA OF A RELATIONSHIP NETWORK GRAPH

CROSS-REFERENCE TO RELATED APPLICATIONS

This application claims priority to Chinese Patent Application No. 202311788004.6, filed on Dec. 22, 2023, which is hereby incorporated by reference in its entirety.

TECHNICAL FIELD

One or more embodiments of this specification is associated with the field of computer technologies, and in particular, to methods and apparatuses for storing graph data of a relationship network graph.

BACKGROUND

A relationship network graph is referred to as a graph for short. Graphs are a type of structure for representing association relationships between objects and are described using vertices and edges. The vertices are also referred to as nodes, and are used to represent objects. The edges are also referred to as connecting edges, and are used to represent relationships between objects. The connecting edges are further classified into undirected connecting edges and directed connecting edges. If a connecting edge between two nodes has no direction, this connecting edge is referred to as an undirected connecting edge. If a connecting edge from one node to another node has a direction, this connecting edge is referred to as a directed connecting edge. Generally, a node corresponds to one or more node attributes, and a connecting edge corresponds to one or more edge attributes. A specific value of a node attribute or an edge attribute possibly belongs to privacy data.

Graph analysis is a series of complex computing performed on objects, relationships, and their attributes included in graph data. As graph data scales up, graph analysis performance often fails to satisfy needs, and an efficient graph data management method is crucial to improving graph analysis performance. Graph data management mainly relies on graph data storage of a relationship network graph.

SUMMARY

One or more embodiments of this specification describe methods and apparatuses for storing graph data of a relationship network graph. The methods and apparatuses can implement efficient graph data management, thereby improving graph analysis performance.

According to a first aspect, a method for storing graph data of a relationship network graph is provided. The relationship network graph includes a directed connecting edge between nodes, and the method includes the following: connection relationship information between any two nodes in the relationship network graph is acquired; based on the connection relationship information, a first mapping relationship between an identifier of each node in the relationship network graph and a node identifier of an outgoing edge-connected node of the node is stored in a compressed sparse row format, and a second mapping relationship between the identifier of each node and a node identifier of an incoming edge-connected node of the node is stored in a compressed sparse column format; a set of attribute information in the relationship network graph is acquired, where the set of attribute information includes several node attributes, several edge attributes, and/or several pieces of temporary information; and each attribute value of the same attribute in the set of attribute information is stored in continuous space by means of column storage.

In some possible implementations, the connection relationship information includes one of the following: an adjacency matrix and an adjacency table.

In some possible implementations, the first mapping relationship between the identifier of each node in the relationship network graph and the node identifier of the outgoing edge-connected node of the node is stored in the compressed sparse row format, including: a node identifier of each target node is stored in a first array; where node identifiers of target nodes corresponding to the same node are continuously arranged; and a location index of the first target node of the same node in the first array is stored in a second array.

Further, node identifiers of nodes in the relationship network graph are sequentially incremented by 1 from an initial value, and location indexes corresponding to different nodes are stored in the second array based on a value sequence of the node identifiers of the nodes; and the method further includes the following: when a target node corresponding to an outgoing edge of a first node is queried, based on a node identifier of the first node, a first location index of the first target node of the first node is acquired from the second array, and a second location index of the first target node of a second node is acquired from the second array; where a node identifier of the second node is 1 greater than the node identifier of the first node; a first index set is determined based on the first location index and the second location index; where the first index set includes each index between the first location index and the second location index, and does not include the second location index; and an identifier of a target node corresponding to each index in the first index set is acquired from the first array, and the identifier of the target node is used as an identifier of each target node corresponding to the outgoing edge of the first node.

In some possible implementations, the second mapping relationship between the identifier of each node and the node identifier of the incoming edge-connected node of the node is stored in the compressed sparse column format, including: a node identifier of each start node is stored in a third array; where node identifiers of start nodes corresponding to the same node are continuously arranged; and a location index of the first start node of the same node in the third array is stored in a fourth array.

Further, node identifiers of nodes in the relationship network graph are sequentially incremented by 1 from an initial value, and location indexes corresponding to different nodes are stored in the fourth array based on a value sequence of the node identifiers of the nodes; and the method further includes the following: when a start node corresponding to an incoming edge of a first node is queried, based on a node identifier of the first node, a third location index of the first start node of the first node is acquired from the fourth array, and a fourth location index of the first start node of a second node is acquired from the fourth array; where a node identifier of the second node is 1 greater than the node identifier of the first node; a second index set is determined based on the third location index and the fourth location index; where the second index set includes each index between the third location index and the fourth location index, and does not include the fourth location index; and an identifier of a start node corresponding to each index in the second index set is acquired from the third array, and the identifier of the start node is used as an identifier of each start node corresponding to the incoming edge of the first node.

In some possible implementations, the storing in continuous space by means of column storage includes the following: indication information indicating whether to perform storage in a disk is extracted based on configuration information of a target attribute; if the indication information indicates to perform storage in a disk, each attribute value of the target attribute is stored in continuous space of the disk; or if the indication information indicates not to perform storage in a disk, each attribute value of the target attribute is stored in continuous space of a memory.

In some possible implementations, the method further includes the following: in a process of performing data analysis on the relationship network graph, a node identifier of an outgoing edge-connected node of a first node is acquired based on the first mapping relationship, or a node identifier of an incoming edge-connected node of a second node is acquired based on the second mapping relationship.

According to a second aspect, an apparatus for storing graph data of a relationship network graph is provided. The relationship network graph includes a directed connecting edge between nodes, and the apparatus includes the following: a first acquisition unit, configured to acquire connection relationship information between any two nodes in the relationship network graph; a first storage unit, configured to, based on the connection relationship information acquired by the first acquisition unit, store a first mapping relationship between an identifier of each node in the relationship network graph and a node identifier of an outgoing edge-connected node of the node in a compressed sparse row format, and store a second mapping relationship between the identifier of each node and a node identifier of an incoming edge-connected node of the node in a compressed sparse column format; a second acquisition unit, configured to acquire a set of attribute information in the relationship network graph, where the set of attribute information includes several node attributes, several edge attributes, and/or several pieces of temporary information; and a second storage unit, configured to store each attribute value of the same attribute in the set of attribute information acquired by the second acquisition unit in continuous space by means of column storage.

According to a third aspect, a computer-readable storage medium is provided. The computer-readable storage medium stores a computer program, and when the computer program is executed in a computer, the computer is enabled to perform the method of the first aspect.

According to a fourth aspect, a computing device is provided, including a storage and a processor. The storage stores executable code, and when executing the executable code, the processor implements the method of the first aspect.

According to the methods and the apparatuses provided in the embodiments of this specification, first, connection relationship information between any two nodes in a relationship network graph is acquired; then, based on the connection relationship information, a first mapping relationship between an identifier of each node in the relationship network graph and a node identifier of an outgoing edge-connected node of the node is stored in a compressed sparse row format, and a second mapping relationship between the identifier of each node and a node identifier of an incoming edge-connected node of the node is stored in a compressed sparse column format; subsequently, a set of attribute information in the relationship network graph is acquired, where the set of attribute information includes several node attributes, several edge attributes, and/or several pieces of temporary information; and finally, each attribute value of the same attribute in the set of attribute information is stored in continuous space by means of column storage. It can be seen from the above-mentioned description that, in the embodiments of this specification, outgoing-edge information and incoming-edge information of a node are respectively stored in the compressed sparse row format and the compressed sparse column format so as to compress as much space as possible, and increase an edge traversal speed. In addition, unlike common application of the compressed sparse row format and compressed sparse column format, the two formats are used only to store basic information, that is, node identifiers. Other information such as vertex attributes, edge attributes, and temporary information in a graph analysis process is structurally fused by means of column storage so as to improve memory access efficiency of the attributes. In summary, efficient graph data management can be implemented, thereby improving graph analysis performance.

BRIEF DESCRIPTION OF DRAWINGS

To describe the technical solutions in the embodiments of this application more clearly, the following briefly describes the accompanying drawings needed for describing the embodiments. Clearly, the accompanying drawings in the following description show merely some embodiments of this application, and a person of ordinary skill in the art can derive other drawings from these accompanying drawings without creative efforts.

DESCRIPTION OF EMBODIMENTS

The following describes the solutions provided in this specification with reference to the accompanying drawings.

Figures 1, 2:
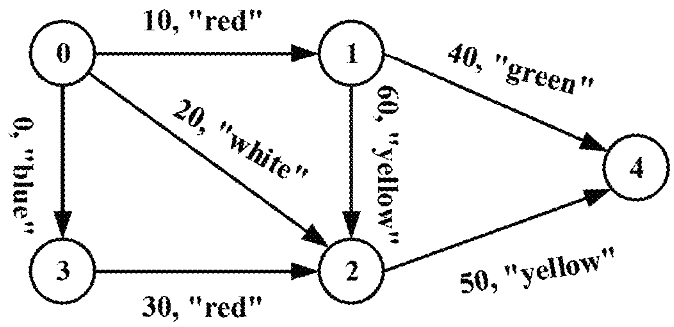
FIG. 1 is a schematic diagram illustrating an implementation scenario of some embodiments, according to disclosure in this specification.
FIG. 2 is a schematic diagram illustrating an adjacency matrix corresponding to FIG. 1, according to disclosure in this specification.

FIG. 1 is a schematic diagram illustrating an implementation scenario of some embodiments, according to disclosure in this specification. This implementation scenario is associated with graph data storage of a relationship network graph. The relationship network graph includes a directed connecting edge between nodes. Generally, connection relationship information between any two nodes in the relationship network graph is stored. As a connecting edge exists between some nodes in the relationship network graph while no connecting edge exists between some other nodes, storage space is greatly wasted and an edge traversal speed during data analysis is relatively slow if both connection relationship information between two nodes that have a connecting edge and connection relationship information between two nodes that have no connecting edge are stored. In addition, graph data further includes some other information, such as node attributes, edge attributes, and temporary information in a graph analysis process. A storage method of the other information affects memory access efficiency of the other information, and accordingly affects data analysis performance.

Referring to FIG. 1, nodes have corresponding node identifiers. For example, in FIG. 1, there are five nodes in total, and node identifiers are respectively node 0, node 1, node 2, node 3, and node 4. A directed connecting edge from a start node to a target node is referred to as an outgoing edge of the start node. For example, node 0 has three outgoing edges, which are respectively a directed connecting edge from node 0 to node 1, a directed connecting edge from node 0 to node 2, and a directed connecting edge from node 0 to node 3. A directed connecting edge from a start node to a target node is referred to as an incoming edge of the target node. For example, node 1 has one incoming edge, which is a directed connecting edge from node 0 to node 1.

The graph data further includes two edge attributes. Corresponding to the two edge attributes, each connecting edge has its own attribute values. For example, the connecting edge from node 0 to node 1 has an attribute value of 10 corresponding to a first edge attribute, and has an attribute value of "red" corresponding to a second edge attribute; and a connecting edge from node 1 to node 4 has an attribute value of 40 corresponding to the first edge attribute, and has an attribute value of "green" corresponding to the second edge attribute.

In the embodiments of this specification, a corresponding solution is proposed for storing the connection relationship information and the other information that are included in the graph data so as to implement efficient graph data management, thereby improving graph analysis performance.

The graph data can be stored in multiple forms, for example, an adjacency matrix, an adjacency table, a compressed sparse row (CSR), and a compressed sparse column (CSC). FIG. 2 is a schematic diagram illustrating an adjacency matrix corresponding to FIG. 1, according to disclosure in this specification. Referring to FIG. 2, rows and columns of the adjacency matrix each correspond to one node. The rows correspond to start nodes, and the columns correspond to target nodes. Corresponding to FIG. 1, which has five nodes in total, the adjacency matrix is therefore a matrix of five rows and five columns. If a connecting edge exists from a start node to a target node, the two nodes correspond to a matrix element of 1. For example, a matrix element with a row index of 0 and a column index of 1 is 1, representing that a directed connecting edge exists from node 0 to node 1. If no connecting edge exists from a start node to a target node, the two nodes correspond to a matrix element of 0. For example, a matrix element with a row index of 0 and a column index of 4 is 0, representing that no directed connecting edge exists from node 0 to node 4. It can be understood that, in FIG. 2, a blank is used to represent a matrix element of 0 for brevity.

Generally, if a quantity of elements with a value of 0 is far greater than a quantity of non-0 elements in a matrix, and the non-0 elements are irregularly distributed, the matrix is a sparse matrix. An adjacency matrix is usually a sparse matrix.

In the embodiments of this specification, due to sparsity of the graph, the CSR and the CSC are used to respectively store outgoing-edge information and incoming-edge information of nodes so as to compress as much space as possible, and increase an edge traversal speed. However, a difference is that the CSR and the CSC are used only to store basic information, such as a node identifier of a start node and a node identifier of a target node. The other information such as the node attributes, the edge attributes, and the temporary information in the graph analysis process is structurally fused by means of column storage so as to improve memory access efficiency of the attributes.

Figure 3:
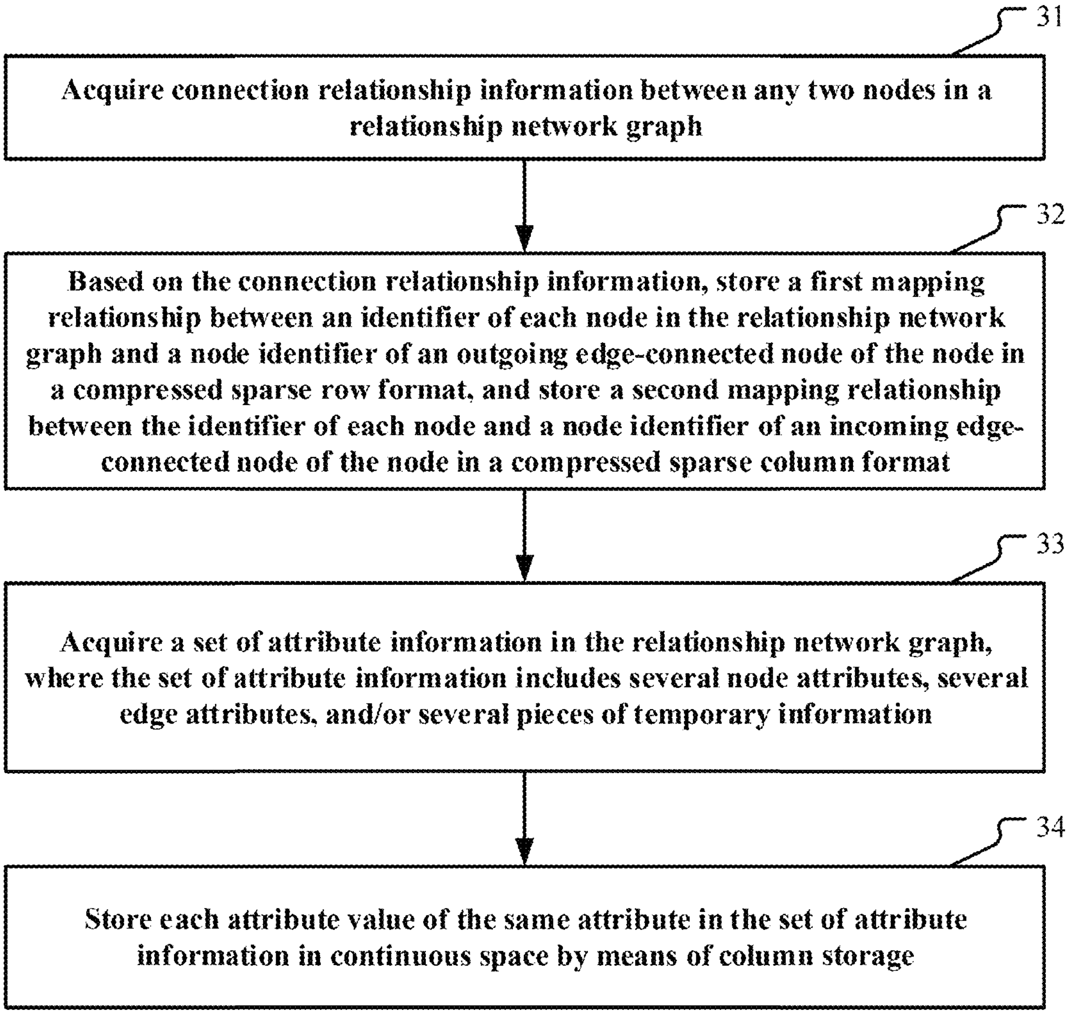
FIG. 3 is a flowchart illustrating a method for storing graph data of a relationship network graph, according to some embodiments.

FIG. 3 is a flowchart illustrating a method for storing graph data of a relationship network graph, according to some embodiments. The relationship network graph includes a directed connecting edge between nodes. The method can be based on the implementation scenario shown in FIG. 1. As shown in FIG. 3, the method for storing graph data of a relationship network graph in the embodiments includes the following steps: step 31: acquire connection relationship information between any two nodes in the relationship network graph; step 32: based on the connection relationship information, store a first mapping relationship between an identifier of each node in the relationship network graph and a node identifier of an outgoing edge-connected node of the node in a compressed sparse row format, and store a second mapping relationship between the identifier of each node and a node identifier of an incoming edge-connected node of the node in a compressed sparse column format; step 33: acquire a set of attribute information in the relationship network graph, where the set of attribute information includes several node attributes, several edge attributes, and/or several pieces of temporary information; and step 34: store each attribute value of the same attribute in the set of attribute information in continuous space by means of column storage. The following describes specific execution methods of the above-mentioned steps.

First, in step 31, the connection relationship information between any two nodes in the relationship network graph is acquired. It can be understood that, the above-mentioned connection relationship information can indicate whether a directed connecting edge exists between any two nodes.

In some examples, the connection relationship information includes one of the following: an adjacency matrix and an adjacency table.

In the examples, the adjacency matrix can be considered as a two-dimensional array, and be configured to store data of a relationship between nodes. The adjacency table is a chained-storage method for a graph, and a data structure of the adjacency table includes two parts: a node and an adjacent point.

Then, in step 32, based on the connection relationship information, the first mapping relationship between the identifier of each node in the relationship network graph and the node identifier of the outgoing edge-connected node of the node is stored in the compressed sparse row format, and the second mapping relationship between the identifier of each node and the node identifier of the incoming edge-connected node of the node is stored in the compressed sparse column format. It can be understood that, in the embodiments of this specification, both outgoing-edge information of a node and incoming-edge information of the node are stored, thereby helping increase an edge traversal speed.

In some examples, the first mapping relationship between the identifier of each node in the relationship network graph and the node identifier of the outgoing edge-connected node of the node is stored in the compressed sparse row format, including: a node identifier of each target node is stored in a first array; where node identifiers of target nodes corresponding to the same node are continuously arranged; and a location index of the first target node of the same node in the first array is stored in a second array.

In the examples, the above-mentioned first mapping relationship is stored by using the first array and the second array.

Figure 4:
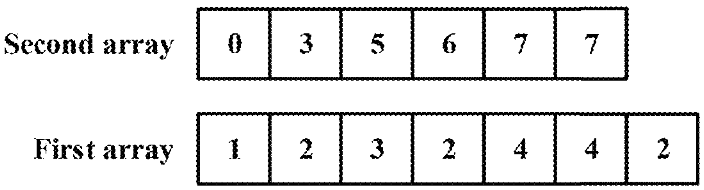
FIG. 4 is a schematic diagram illustrating a compressed sparse row storage format, according to some embodiments.

FIG. 4 is a schematic diagram illustrating a compressed sparse row storage format, according to some embodiments. Referring to FIG. 4, the first array and the second array are used to represent outgoing-edge information of each node. A node identifier of a target node connected to an outgoing edge of a node corresponding to a row in an adjacency matrix can be determined by using a column corresponding to a non-0 element in the same row so as to obtain the first array. For example, target nodes connected to the outgoing edges of node 0 are node 1, node 2, and node 3, target nodes connected to outgoing edges of node 1 are node 2 and node 4, a target node connected to an outgoing edge of node 2 is node 4, a target node connected to an outgoing edge of node 3 is node 2, and node 4 has no outgoing edge. Elements in the obtained first array are successively 1, 2, 3, 2, 4, 4, and 2. It can be understood that, these elements represent node identifiers. After the first array is obtained, the location index of the first target node of the same node in the first array can be successively determined so as to obtain the second array. The location index can be a value sequentially incremented from 0. For example, a location index of the first target node of node 0 in the first array is 0, a location index of the first target node of node 1 in the first array is 3, a location index of the first target node of node 2 in the first array is 5, and a location index of the first target node of node 3 in the first array is 6. Because node 4 has no outgoing edge, assume that node 4 has one outgoing edge, and a location index of the first target node of node 4 in the first array is 7. Elements in the obtained second array are successively 0, 3, 5, 6, 7, and 7. It can be understood that, these elements represent the location indexes in the first array, and the last element 7 represents that there are seven target nodes in total.

Further, node identifiers of nodes in the relationship network graph are sequentially incremented by 1 from an initial value, and location indexes corresponding to different nodes are stored in the second array based on a value sequence of the node identifiers of the nodes; and the method further includes the following: when a target node corresponding to an outgoing edge of a first node is queried, based on a node identifier of the first node, a first location index of the first target node of the first node is acquired from the second array, and a second location index of the first target node of a second node is acquired from the second array; where a node identifier of the second node is 1 greater than the node identifier of the first node; a first index set is determined based on the first location index and the second location index; where the first index set includes each index between the first location index and the second location index, and does not include the second location index; and an identifier of a target node corresponding to each index in the first index set is acquired from the first array, and the identifier of the target node is used as an identifier of each target node corresponding to the outgoing edge of the first node.

For example, referring to FIG. 4, when the target nodes corresponding to the outgoing edges of node 0 are queried, an index range 0-3 (excluding 3) of location indexes of node 0 in the first array is first obtained by using the second array. In this case, node 0 corresponds to the first three values 1, 2, and 3 in the first array, that is, the target nodes respectively corresponding to the three outgoing edges of node 0 are node 1, node 2, and node 3. Similarly, an index range 3-5 (excluding 5) of location indexes of node 1 in the first array is first obtained by using the second array. In this case, node 1 corresponds to the fourth and fifth values 2 and 4 in the first array, that is, the target nodes respectively corresponding to the two outgoing edges of node 1 are node 2 and node 4.

In some examples, the second mapping relationship between the identifier of each node and the node identifier of the incoming edge-connected node of the node is stored in the compressed sparse column format, including: a node identifier of each start node is stored in a third array; where node identifiers of start nodes corresponding to the same node are continuously arranged; and a location index of the first start node of the same node in the third array is stored in a fourth array.

In the examples, the above-mentioned second mapping relationship is stored by using the third array and the fourth array.

Figures 5, 6:
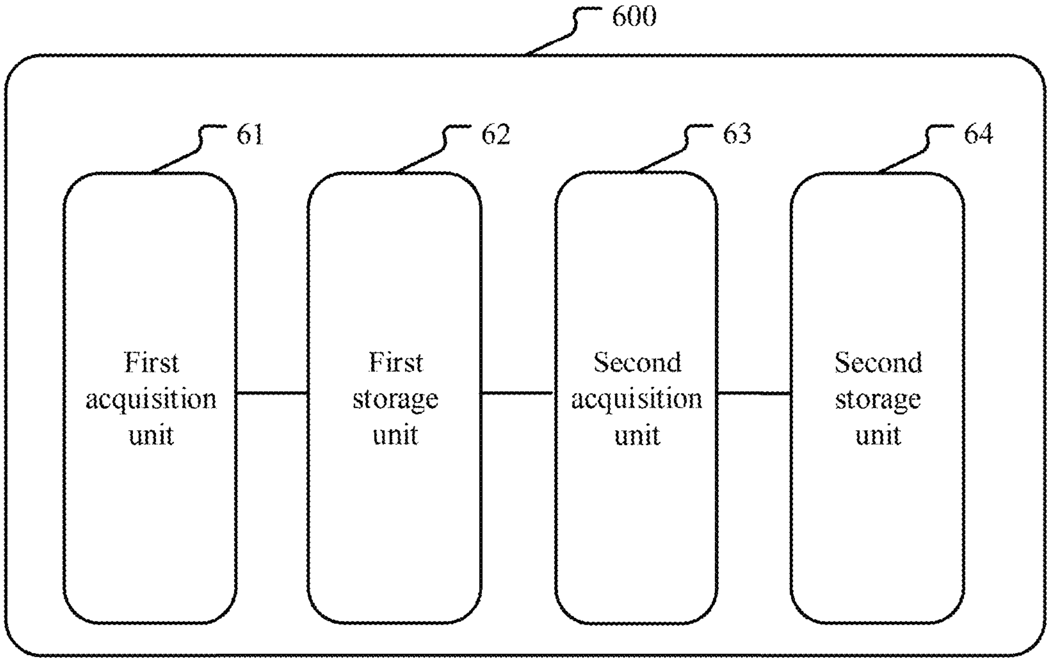
FIG. 5 is a schematic diagram illustrating a compressed sparse column storage format, according to some embodiments.
FIG. 6 is a schematic block diagram illustrating an apparatus for storing graph data of a relationship network graph, according to some embodiments.

FIG. 5 is a schematic diagram illustrating a compressed sparse column storage format, according to some embodiments. Referring to FIG. 5, the third array and the fourth array are used to represent outgoing-edge information of each node. A node identifier of a start node connected to an incoming edge of a node corresponding to a column in an adjacency matrix can be determined by using a row corresponding to a non-0 element in the same column so as to obtain the third array. For example, node 0 has no incoming edge, a start node connected to the incoming edge of node 1 is node 0, start nodes connected to incoming edges of node 2 are node 0, node 1, and node 3, a start node connected to an incoming edge of node 3 is node 0, and start nodes connected to incoming edges of node 4 are node 1 and node 2. Elements in the obtained third array are successively 0, 0, 1, 3, 0, 1, and 2. It can be understood that, these elements represent node identifiers. After the third array is obtained, the location index of the first start node of the same node in the third array can be successively determined so as to obtain the fourth array. The location index can be a value sequentially incremented from 0. For example, because node 0 has no incoming edge, assume that node 0 has one incoming edge; and a location index of the first start node of node 0 in the third array is 0, a location index of the first start node of node 1 in the third array is 0, a location index of the first start node of node 2 in the third array is 1, a location index of the first start node of node 3 in the third array is 4, and a location index of the first start node of node 4 in the third array is 5. Elements in the obtained fourth array are successively 0, 0, 1, 4, 5, and 7. It can be understood that, these elements represent the location indexes in the third array, and the last element 7 represents that there are seven start nodes in total.

Further, node identifiers of nodes in the relationship network graph are sequentially incremented by 1 from an initial value, and location indexes corresponding to different nodes are stored in the fourth array based on a value sequence of the node identifiers of the nodes; and the method further includes the following: when a start node corresponding to an incoming edge of a first node is queried, based on a node identifier of the first node, a third location index of the first start node of the first node is acquired from the fourth array, and a fourth location index of the first start node of a second node is acquired from the fourth array; where a node identifier of the second node is 1 greater than the node identifier of the first node; a second index set is determined based on the third location index and the fourth location index; where the second index set includes each index between the third location index and the fourth location index, and does not include the fourth location index; and an identifier of a start node corresponding to each index in the second index set is acquired from the third array, and the identifier of the start node is used as an identifier of each start node corresponding to the incoming edge of the first node.

For example, referring to FIG. 5, when the start node corresponding to the incoming edge of node 1 is queried, an index range 0-1 (excluding 1) of location indexes of node 1 in the third array is first obtained by using the fourth array. In this case, node 1 corresponds to the first value 0 in the third array, that is, the start node corresponding to the one incoming edge of node 1 is node 0. Similarly, an index range 1-4 (excluding 4) of location indexes of node 2 in the third array is first obtained by using the fourth array. In this case, node 2 corresponds to the second to fourth values 0, 1, and 3 in the third array, that is, the start nodes respectively corresponding to the three incoming edges of node 2 are node 0, node 1, and node 3.

Subsequently, in step 33, the set of attribute information in the relationship network graph is acquired, where the set of attribute information includes several node attributes, several edge attributes, and/or several pieces of temporary information. It can be understood that, the above-mentioned temporary information can be an intermediate result generated in a data analysis process.

In the embodiments of this specification, according to a specific application scenario, the set of attribute information can have all of the node attributes, the edge attributes, and the temporary information, or the set of attribute information can have only the node attributes and the temporary information but no edge attributes, or the set of attribute information can have only the edge attributes and the temporary information but no node attributes. There can be many specific cases, and details are omitted here for simplicity.

Finally, in step 34, each attribute value of the same attribute in the set of attribute information is stored in continuous space by means of column storage. It can be understood that, the same attribute mentioned above can be understood as one column or one field in a data table.

In the embodiments of this specification, the node attributes, the edge attributes, and the temporary information in a computing process are managed by using column storage-based structured fusion. A compact arrangement method for each attribute in the column storage-based structured fusion not only can improve memory access efficiency, but also can facilitate management.

In some examples, the storing in continuous space by means of column storage includes the following: indication information indicating whether to perform storage in a disk is extracted based on configuration information of a target attribute; if the indication information indicates to perform storage in a disk, each attribute value of the target attribute is stored in continuous space of the disk; or if the indication information indicates not to perform storage in a disk, each attribute value of the target attribute is stored in continuous space of a memory.

In the examples, some attribute values can be stored in a disk to reduce memory occupation in the graph analysis process.

In the embodiments of this specification, a user can add configuration information of each attribute by providing definition support similar to a table schema. As some examples, Table 1 shows configuration information of two edge attributes.

TABLE 1

| Configuration information | | |
|---|---|---|
| Name | Type | Indication information (cold) |
| c1 | int | false |
| c2 | string | true |

Referring to Table 1, the two edge attributes are respectively named c1 and c2, the types are respectively an integer type (int) and a string type (string), and the indication information is false (false) and true (true), which respectively indicate that cold storage is not supported and cold storage is supported. Cold storage is storage in a disk, which can reduce memory occupation in the graph analysis process.

In the embodiments of this specification, a graph analysis task stores each attribute value of each attribute in one piece of continuous space of a disk or one piece of consecutive space of a memory based on the configuration information. As some examples, Table 2 shows attribute values of the two edge attributes corresponding to different connecting edges.

TABLE 2

| Attribute values of the two edge attributes corresponding to different connecting edges | | | |
|---|---|---|---|
| src | dst | c1 | c2 |
| 0 | 1 | 10 | red |
| 0 | 2 | 20 | white |
| 0 | 3 | 0 | blue |
| 1 | 2 | 60 | yellow |
| 1 | 4 | 40 | green |
| 2 | 4 | 50 | yellow |
| 3 | 2 | 30 | red |

Referring to Table 2, src represents a start node of a connecting edge; dst represents a target node of a connecting edge; corresponding to a connecting edge from node 0 to node 1, an attribute value of the edge attribute c1 is 10, and an attribute value of the edge attribute c2 is red; and corresponding to a connecting edge from node 0 to node 2, an attribute value of the edge attribute c1 is 20, and an attribute value of the edge attribute c2 is white. It can be understood that, one attribute corresponds to one column in a data table, and column storage can be used to improve memory access efficiency in data analysis.

In some examples, the method further includes the following: in a process of performing data analysis on the relationship network graph, a node identifier of an outgoing edge-connected node of a first node is acquired based on the first mapping relationship, or a node identifier of an incoming edge-connected node of a second node is acquired based on the second mapping relationship.

In the examples, because both outgoing-edge information of a node and incoming-edge information of the node are stored, the outgoing-edge information or the incoming-edge information can be flexibly selected in a data analysis process so as to increase an edge traversal speed.

According to the methods provided in the embodiments of this specification, first, connection relationship information between any two nodes in a relationship network graph is acquired; then, based on the connection relationship information, a first mapping relationship between an identifier of each node in the relationship network graph and a node identifier of an outgoing edge-connected node of the node is stored in a compressed sparse row format, and a second mapping relationship between the identifier of each node and a node identifier of an incoming edge-connected node of the node is stored in a compressed sparse column format; subsequently, a set of attribute information in the relationship network graph is acquired, where the set of attribute information includes several node attributes, several edge attributes, and/or several pieces of temporary information; and finally, each attribute value of the same attribute in the set of attribute information is stored in continuous space by means of column storage. It can be seen from the above-mentioned description that, in the embodiments of this specification, outgoing-edge information and incoming-edge information of a node are respectively stored in the compressed sparse row format and the compressed sparse column format so as to compress as much space as possible, and increase an edge traversal speed. In addition, unlike common application of the compressed sparse row format and compressed sparse column format, the two formats are used only to store basic information, that is, node identifiers. Other information such as vertex attributes, edge attributes, and temporary information in a graph analysis process is structurally fused by means of column storage so as to improve memory access efficiency of the attributes. In summary, efficient graph data management can be implemented, thereby improving graph analysis performance.

According to some embodiments of another aspect, an apparatus for storing graph data of a relationship network graph is further provided. The relationship network graph includes a directed connecting edge between nodes, and the apparatus is configured to execute the methods provided in the embodiments of this specification. FIG. 6 is a schematic block diagram illustrating an apparatus for storing graph data of a relationship network graph, according to some embodiments. As shown in FIG. 6, the apparatus 600 includes the following: a first acquisition unit 61, configured to acquire connection relationship information between any two nodes in the relationship network graph; a first storage unit 62, configured to, based on the connection relationship information acquired by the first acquisition unit 61, store a first mapping relationship between an identifier of each node in the relationship network graph and a node identifier of an outgoing edge-connected node of the node in a compressed sparse row format, and store a second mapping relationship between the identifier of each node and a node identifier of an incoming edge-connected node of the node in a compressed sparse column format; a second acquisition unit 63, configured to acquire a set of attribute information in the relationship network graph, where the set of attribute information includes several node attributes, several edge attributes, and/or several pieces of temporary information; and a second storage unit 64, configured to store each attribute value of the same attribute in the set of attribute information acquired by the second acquisition unit 63 in continuous space by means of column storage.

Optionally, as some embodiments, the connection relationship information includes one of the following: an adjacency matrix and an adjacency table.

Optionally, as some embodiments, the first storage unit 62 includes the following: a first storage subunit, configured to store a node identifier of each target node in a first array; where node identifiers of target nodes corresponding to the same node are continuously arranged; and a second storage subunit, configured to store, in a second array, a location index of the first target node of the same node in the first array obtained by the first storage subunit.

Further, node identifiers of nodes in the relationship network graph are sequentially incremented by 1 from an initial value, and location indexes corresponding to different nodes are stored in the second array based on a value sequence of the node identifiers of the nodes; and the apparatus further includes the following: a first query unit, configured to: when a target node corresponding to an outgoing edge of a first node is queried, based on a node identifier of the first node, acquire a first location index of the first target node of the first node from the second array, and acquire a second location index of the first target node of a second node from the second array; where a node identifier of the second node is 1 greater than the node identifier of the first node; determine a first index set based on the first location index and the second location index; where the first index set includes each index between the first location index and the second location index, and does not include the second location index; and acquire, from the first array, an identifier of a target node corresponding to each index in the first index set, and use the identifier of the target node as an identifier of each target node corresponding to the outgoing edge of the first node.

Optionally, as some embodiments, the first storage unit 62 includes the following: a third storage subunit, configured to store a node identifier of each start node in a third array; where node identifiers of start nodes corresponding to the same node are continuously arranged; and a fourth storage subunit, configured to store, in a fourth array, a location index of the first start node of the same node in the third array.

Further, node identifiers of nodes in the relationship network graph are sequentially incremented by 1 from an initial value, and location indexes corresponding to different nodes are stored in the fourth array based on a value sequence of the node identifiers of the nodes; and the apparatus further includes the following: a second query unit, configured to: when a start node corresponding to an incoming edge of a first node is queried, based on a node identifier of the first node, acquire a third location index of the first start node of the first node from the fourth array, and acquire a fourth location index of the first start node of a second node from the fourth array; where a node identifier of the second node is 1 greater than the node identifier of the first node; determine a second index set based on the third location index and the fourth location index; where the second index set includes each index between the third location index and the fourth location index, and does not include the fourth location index; and acquire, from the third array, an identifier of a start node corresponding to each index in the second index set, and use the identifier of the start node as an identifier of each start node corresponding to the incoming edge of the first node.

Optionally, as some embodiments, the second storage unit 64 includes the following: an extraction subunit, configured to extract, based on configuration information of a target attribute, indication information indicating whether to perform storage in a disk; a fifth storage subunit, configured to, if the indication information obtained by the extraction subunit indicates to perform storage in a disk, store each attribute value of the target attribute in continuous space of the disk; or a sixth storage subunit, configured to, if the indication information obtained by the extraction subunit indicates not to perform storage in a disk, store each attribute value of the target attribute in continuous space of a memory.

Optionally, as some embodiments, the apparatus further includes the following: an analysis unit, configured to, in a process of performing data analysis on the relationship network graph, acquire a node identifier of an outgoing edge-connected node of a first node based on the first mapping relationship, or acquire a node identifier of an incoming edge-connected node of a second node based on the second mapping relationship.

According to the apparatuses provided in the embodiments of this specification, first, the first acquisition unit 61 acquires connection relationship information between any two nodes in a relationship network graph; then, based on the connection relationship information, the first storage unit 62 stores a first mapping relationship between an identifier of each node in the relationship network graph and a node identifier of an outgoing edge-connected node of the node in a compressed sparse row format, and stores a second mapping relationship between the identifier of each node and a node identifier of an incoming edge-connected node of the node in a compressed sparse column format; subsequently, the second acquisition unit 63 acquires a set of attribute information in the relationship network graph, where the set of attribute information includes several node attributes, several edge attributes, and/or several pieces of temporary information; and finally, the second storage unit 64 stores each attribute value of the same attribute in the set of attribute information in continuous space by means of column storage. It can be seen from the above-mentioned description that, in the embodiments of this specification, outgoing-edge information and incoming-edge information of a node are respectively stored in the compressed sparse row format and the compressed sparse column format so as to compress as much space as possible, and increase an edge traversal speed. In addition, unlike common application of the compressed sparse row format and compressed sparse column format, the two formats are used only to store basic information, that is, node identifiers. Other information such as vertex attributes, edge attributes, and temporary information in a graph analysis process is structurally fused by means of column storage so as to improve memory access efficiency of the attributes. In summary, efficient graph data management can be implemented, thereby improving graph analysis performance.

According to some embodiments of another aspect, a computer-readable storage medium is further provided. The computer-readable storage medium stores a computer program, and when the computer program is executed in a computer, the computer is enabled to perform the method described with reference to FIG. 3.

According to some embodiments of still another aspect, a computing device is further provided, including a storage and a processor. The storage stores executable code, and when executing the executable code, the processor implements the method described with reference to FIG. 3.

A person skilled in the art should be aware that in the above-mentioned one or more examples, functions described in this application can be implemented by hardware, software, firmware, or any combination thereof. When implemented by using software, these functions can be stored in a computer-readable medium or transmitted as one or more instructions or one or more pieces of code on a computer-readable medium.

The above-mentioned specific implementations further describe in detail the objectives, technical solutions, and beneficial effects of this application. It should be understood that the descriptions above are merely specific implementations of this application and are not intended to limit the protection scope of this application. Any modifications, equivalent replacements, or improvements made on the basis of the technical solutions of this application shall fall within the protection scope of this application.

What is claimed is:

1. A computer implemented method for graph data storage, comprising:

acquiring connection relationship information between any two nodes in a relationship network graph, wherein the relationship network graph comprises a directed connecting edge between nodes;

based on the connection relationship information, storing a first mapping relationship between an identifier of each node in the relationship network graph and a node identifier of an outgoing edge-connected node of the node in a compressed sparse row format, and storing a second mapping relationship between the identifier of each node and a node identifier of an incoming edge-connected node of the node in a compressed sparse column format;

acquiring a set of attribute information in the relationship network graph, wherein the set of attribute information comprises several node attributes, several edge attributes, and/or several pieces of temporary information; and storing, using column storage, each attribute value of a same attribute in the set of attribute information in continuous space.

2. The computer implemented method of claim 1, wherein the connection relationship information comprises one of: an adjacency matrix or an adjacency table.

3. The computer implemented method of claim 1, wherein storing a first mapping relationship between an identifier of each node in the relationship network graph and a node identifier of an outgoing edge-connected node of the node in a compressed sparse row format, comprises:

storing a node identifier of each target node in a first array; wherein node identifiers of target nodes corresponding to a same node are continuously arranged; and storing, in a second array, a location index of a first target node of a same node in the first array.

4. The computer implemented method of claim 3, wherein:

node identifiers of nodes in the relationship network graph are sequentially incremented by 1 from an initial value and location indexes corresponding to different nodes are stored in the second array based on a value sequence of the node identifiers of the nodes; and comprising:

when a target node corresponding to an outgoing edge of a first node is queried, based on a node identifier of the first node, acquiring a first location index of the first target node of the first node from the second array;

acquiring a second location index of the first target node of a second node from the second array, wherein a node identifier of the second node is 1 greater than the node identifier of the first node;

determining a first index set based on the first location index and the second location index, wherein the first index set comprises each index between the first location index and the second location index and does not comprise the second location index;

acquiring, from the first array, an identifier of a target node corresponding to each index in the first index set; and using the identifier of the target node as an identifier of each target node corresponding to the outgoing edge of the first node.

5. The computer implemented method of claim 1, wherein storing a second mapping relationship between the identifier of each node and a node identifier of an incoming edge-connected node of the node in a compressed sparse column format, comprises:

storing a node identifier of each start node in a third array; wherein node identifiers of start nodes corresponding to a same node are continuously arranged; and storing, in a fourth array, a location index of a first start node of a same node in the third array.

6. The computer implemented method of claim 5, wherein:

node identifiers of nodes in the relationship network graph are sequentially incremented by 1 from an initial value;

location indexes corresponding to different nodes are stored in the fourth array based on a value sequence of the node identifiers of the nodes; and comprising:

when a start node corresponding to an incoming edge of a first node is queried, based on a node identifier of the first node, acquiring a third location index of the first start node of the first node from the fourth array;

acquiring a fourth location index of the first start node of a second node from the fourth array, wherein a node identifier of the second node is 1 greater than the node identifier of the first node;

determining a second index set based on the third location index and the fourth location index, wherein the second index set comprises each index between the third location index and the fourth location index and does not comprise the fourth location index;

acquiring, from the third array, an identifier of a start node corresponding to each index in the second index set; and using the identifier of the start node as an identifier of each start node corresponding to the incoming edge of the first node.

7. The computer implemented method of claim 1, wherein storing, using column storage, each attribute value of a same attribute in the set of attribute information in continuous space, comprises:

extracting, based on configuration information of a target attribute, indication information indicating whether to perform storage in a disk.

8. The computer implemented method of claim 7, comprising:

if the indication information indicates to perform storage in a disk, storing each attribute value of the target attribute in continuous space of the disk; or if the indication information indicates not to perform storage in a disk, storing each attribute value of the target attribute in continuous space of a memory.

9. The computer implemented method of claim 1, comprising:

in a process of performing data analysis on the relationship network graph, acquiring a node identifier of an outgoing edge-connected node of a first node based on the first mapping relationship, or acquiring a node identifier of an incoming edge-connected node of a second node based on the second mapping relationship.

10. A non-transitory, computer-readable medium storing one or more instructions executable by a computer system to perform one or more operations for graph data storage, comprising:

acquiring connection relationship information between any two nodes in a relationship network graph, wherein the relationship network graph comprises a directed connecting edge between nodes;

based on the connection relationship information, storing a first mapping relationship between an identifier of each node in the relationship network graph and a node identifier of an outgoing edge-connected node of the node in a compressed sparse row format, and storing a second mapping relationship between the identifier of each node and a node identifier of an incoming edge-connected node of the node in a compressed sparse column format;

acquiring a set of attribute information in the relationship network graph, wherein the set of attribute information comprises several node attributes, several edge attributes, and/or several pieces of temporary information; and storing, using column storage, each attribute value of a same attribute in the set of attribute information in continuous space.

11. The non-transitory, computer-readable medium of claim 10, wherein the connection relationship information comprises one of: an adjacency matrix or an adjacency table.

12. The non-transitory, computer-readable medium of claim 10, wherein storing a first mapping relationship between an identifier of each node in the relationship network graph and a node identifier of an outgoing edge-connected node of the node in a compressed sparse row format, comprises:

storing a node identifier of each target node in a first array; wherein node identifiers of target nodes corresponding to a same node are continuously arranged; and storing, in a second array, a location index of a first target node of a same node in the first array.

13. The non-transitory, computer-readable medium of claim 12, wherein:

node identifiers of nodes in the relationship network graph are sequentially incremented by 1 from an initial value and location indexes corresponding to different nodes are stored in the second array based on a value sequence of the node identifiers of the nodes; and comprising:

when a target node corresponding to an outgoing edge of a first node is queried, based on a node identifier of the first node, acquiring a first location index of the first target node of the first node from the second array;

acquiring a second location index of the first target node of a second node from the second array, wherein a node identifier of the second node is 1 greater than the node identifier of the first node;

determining a first index set based on the first location index and the second location index, wherein the first index set comprises each index between the first location index and the second location index and does not comprise the second location index;

acquiring, from the first array, an identifier of a target node corresponding to each index in the first index set; and using the identifier of the target node as an identifier of each target node corresponding to the outgoing edge of the first node.

14. The non-transitory, computer-readable medium of claim 10, wherein storing a second mapping relationship between the identifier of each node and a node identifier of an incoming edge-connected node of the node in a compressed sparse column format, comprises:

storing a node identifier of each start node in a third array; wherein node identifiers of start nodes corresponding to a same node are continuously arranged; and storing, in a fourth array, a location index of a first start node of a same node in the third array.

15. The non-transitory, computer-readable medium of claim 14, wherein:

node identifiers of nodes in the relationship network graph are sequentially incremented by 1 from an initial value;

location indexes corresponding to different nodes are stored in the fourth array based on a value sequence of the node identifiers of the nodes; and comprising:

when a start node corresponding to an incoming edge of a first node is queried, based on a node identifier of the first node, acquiring a third location index of the first start node of the first node from the fourth array;

acquiring a fourth location index of the first start node of a second node from the fourth array, wherein a node identifier of the second node is 1 greater than the node identifier of the first node;

determining a second index set based on the third location index and the fourth location index, wherein the second index set comprises each index between the third location index and the fourth location index and does not comprise the fourth location index;

acquiring, from the third array, an identifier of a start node corresponding to each index in the second index set; and using the identifier of the start node as an identifier of each start node corresponding to the incoming edge of the first node.

16. The non-transitory, computer-readable medium of claim 10, wherein storing, using column storage, each attribute value of a same attribute in the set of attribute information in continuous space, comprises:

extracting, based on configuration information of a target attribute, indication information indicating whether to perform storage in a disk.

17. The non-transitory, computer-readable medium of claim 16, comprising:

if the indication information indicates to perform storage in a disk, storing each attribute value of the target attribute in continuous space of the disk; or if the indication information indicates not to perform storage in a disk, storing each attribute value of the target attribute in continuous space of a memory.

18. The non-transitory, computer-readable medium of claim 10, comprising:

in a process of performing data analysis on the relationship network graph, acquiring a node identifier of an outgoing edge-connected node of a first node based on the first mapping relationship, or acquiring a node identifier of an incoming edge-connected node of a second node based on the second mapping relationship.

19. A computer-implemented system for graph data storage, comprising:

one or more computers; and one or more computer memory devices interoperably coupled with the one or more computers and having tangible, non-transitory, machine-readable media storing one or more instructions that, when executed by the one or more computers, perform one or more operations, comprising:

acquiring connection relationship information between any two nodes in a relationship network graph, wherein the relationship network graph comprises a directed connecting edge between nodes;

based on the connection relationship information, storing a first mapping relationship between an identifier of each node in the relationship network graph and a node identifier of an outgoing edge-connected node of the node in a compressed sparse row format, and storing a second mapping relationship between the identifier of each node and a node identifier of an incoming edge-connected node of the node in a compressed sparse column format;

acquiring a set of attribute information in the relationship network graph, wherein the set of attribute information comprises several node attributes, several edge attributes, and/or several pieces of temporary information; and storing, using column storage, each attribute value of a same attribute in the set of attribute information in continuous space.

20. The computer-implemented system of claim 19, wherein the connection relationship information comprises one of: an adjacency matrix or an adjacency table.

* * * * *